(12) United States Patent
Hoffend, Jr. et al.

(10) Patent No.: US 6,228,555 B1
(45) Date of Patent: May 8, 2001

(54) THERMAL MASS TRANSFER DONOR ELEMENT

(75) Inventors: Thomas R. Hoffend, Jr.; John S. Staral, both of Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/474,002

(22) Filed: Dec. 28, 1999

(51) Int. Cl.[7] .............................. G03F 7/34; G03F 7/095; G03F 7/11
(52) U.S. Cl. .................. 430/200; 430/271.1; 430/273.1; 430/275.1; 430/964; 430/201
(58) Field of Search ................................. 430/200, 201, 430/273.1, 275.1, 271.1, 964

(56) References Cited

U.S. PATENT DOCUMENTS

| | | |
|---|---|---|
| 4,252,671 | 2/1981 | Smith . |
| 4,387,156 | 6/1983 | Crawford et al. .................. 430/271 |
| 4,426,437 | 1/1984 | Fisch et al. ......................... 430/166 |
| 4,599,298 | 7/1986 | Fisch .................................. 430/201 |
| 4,623,896 | 11/1986 | Hausslein ........................... 346/1.1 |
| 4,657,840 | 4/1987 | Fisch .................................. 430/201 |
| 5,089,372 | 2/1992 | Kirihata et al. .................... 430/167 |
| 5,156,938 | 10/1992 | Foley et al. ........................ 430/200 |
| 5,166,024 | 11/1992 | Bugner et al. ....................... 430/70 |
| 5,171,650 | 12/1992 | Ellis et al. .......................... 430/201 |
| 5,232,814 | 8/1993 | Graves et al. ...................... 430/158 |
| 5,244,770 | 9/1993 | DeBoer et al. ..................... 430/200 |
| 5,256,506 | 10/1993 | Ellis et al. .......................... 430/201 |
| 5,308,737 | 5/1994 | Bills et al. .......................... 430/201 |
| 5,326,619 | 7/1994 | Dower et al. ...................... 430/201 |
| 5,351,617 | 10/1994 | Williams et al. ................... 101/467 |
| 5,387,496 | 2/1995 | DeBoer .............................. 430/322 |
| 5,459,016 | 10/1995 | Debe et al. ......................... 430/201 |
| 5,501,938 | 3/1996 | Ellis et al. .......................... 430/201 |
| 5,521,035 | 5/1996 | Wolk et al. ......................... 430/200 |
| 5,593,808 | 1/1997 | Ellis .................................... 430/201 |
| 5,605,780 | 2/1997 | Burberry et al. ................. 430/278.1 |
| 5,612,165 | 3/1997 | Ellis .................................... 430/201 |
| 5,622,795 | 4/1997 | Ellis .................................... 430/201 |
| 5,645,963 | 7/1997 | Chang ..................................... 430/7 |
| 5,685,939 | 11/1997 | Wolk et al. ......................... 156/234 |
| 5,688,551 | 11/1997 | Littman et al. . |
| 5,691,098 | 11/1997 | Busman et al. .................... 430/200 |
| 5,691,114 | 11/1997 | Burberry et al. .................. 430/302 |
| 5,693,446 | 12/1997 | Staral et al. ........................ 430/201 |
| 5,695,907 | 12/1997 | Chang ................................. 430/201 |
| 5,710,097 | 1/1998 | Staral et al. ........................ 430/201 |
| 5,725,989 | 3/1998 | Chang et al. ....................... 430/201 |
| 5,766,827 | 6/1998 | Bills et al. .......................... 430/200 |
| 5,828,488 | 10/1998 | Ouderkirk et al. ................. 359/487 |
| 5,856,064 | 1/1999 | Chou .................................. 430/253 |
| 5,863,860 | 1/1999 | Patel et al. ......................... 430/201 |
| 5,882,774 | 3/1999 | Jonza et al. ........................ 428/212 |
| 5,994,028 | * 11/1999 | Lee ..................................... 430/201 |

FOREIGN PATENT DOCUMENTS

| | | |
|---|---|---|
| 0 368 552 A2 | 5/1990 | (EP) . |
| 530 018 | 4/1998 | (EP) . |
| WO 93/25392 | 12/1993 | (WO) . |
| WO 95/17303 | 6/1995 | (WO) . |
| WO 97/15173 | 4/1997 | (WO) . |
| WO 98/03346 | 1/1998 | (WO) . |
| WO 99/46961 | 9/1999 | (WO) . |

* cited by examiner

Primary Examiner—Richard L. Schilling
(74) Attorney, Agent, or Firm—Robert J. Pechman

(57) ABSTRACT

A thermal mass transfer donor element is provided that includes a thermal transfer layer and a light-to-heat conversion layer, wherein the light-to-heat conversion layer has at least two regions exhibiting different absorption coefficients. The thermal transfer donor elements provided can improve imaging performance by increasing transfer sensitivity and decreasing imaging defects.

51 Claims, 5 Drawing Sheets

THERMAL MASS TRANSFER DONOR ELEMENT

This invention relates to thermal mass transfer donor elements for transferring materials to a receptor.

BACKGROUND

The thermal transfer of layers from a thermal transfer element to a receptor has been suggested for the preparation of a variety of products. Such products include, for example, color filters, spacers, black matrix layers, polarizers, printed circuit boards, displays (for example, liquid crystal and emissive displays), polarizers, z-axis conductors, and other items that can be formed by thermal transfer including, for example, those described in U.S. Pat. Nos. 5,156,938; 5,171,650; 5,244,770; 5,256,506; 5,387,496; 5,501,938; 5,521,035; 5,593,808; 5,605,780; 5,612,165; 5,622,795; 5,685,939; 5,691,114; 5,693,446; and 5,710,097 and International Publication Nos. WO 98/03346 and WO 97/15173, incorporated herein by reference.

For many of these products, resolution and edge sharpness are important factors in the manufacture of the product. Another factor is the size of the transferred portion of the thermal transfer element for a given amount of thermal energy. As an example, when lines or other shapes are transferred, the linewidth or diameter of the shape depends on the size of the resistive element or light beam used to pattern the thermal transfer element. The linewidth or diameter also depends on the ability of the thermal transfer element to transfer energy. Near the edges of the resistive element or light beam, the energy provided to the thermal transfer element may be reduced. Thermal transfer elements with better thermal conduction, less thermal loss, more sensitive transfer coatings, and/or better light-to-heat conversion typically produce larger linewidths or diameters. Thus, the linewidth or diameter can be a reflection of the efficiency of the thermal transfer element in performing the thermal transfer function.

SUMMARY OF THE INVENTION

One manner in which thermal transfer properties can be improved is by improvements in the formulation of the transfer layer material. For example, co-assigned U.S. patent application Ser. No. 09/392,386 discloses including a plasticizer in the transfer layer to improve transfer properties. Other ways to improve transfer fidelity during laser induced thermal transfer include increasing the laser power and/or fluence incident on the donor media. However, increasing laser power or fluence can lead to imaging defects, presumably caused in part by overheating of one or more layers in the donor media.

The present invention recognizes problems associated with trying to improve the sensitivity of thermal transfer and offers new approaches. The present invention provides improved constructions for thermal mass transfer donor elements, specifically providing new light-to-heat conversion layer (LTHC) constructions. The constructions and methods of the present invention can be used to provide thermal transfer donor elements that exhibit, for example, higher transfer sensitivity, fewer imaging defects (e.g., those defects related to donor element over-heating), and the like.

In one embodiment, the present invention provides a thermal mass transfer donor element that includes a thermal transfer layer and a light-to-heat conversion layer, wherein the light-to-heat conversion layer has at least two regions exhibiting different absorption coefficients. For example, the absorption coefficient can vary through the thickness of the light-to-heat conversion layer.

In another embodiment, the present invention provides a thermal mass transfer donor element that includes a thermal transfer layer and a non-homogeneous light-to-heat conversion layer, where the donor element is capable of being used for imagewise thermal mass transfer of material from the transfer layer to a receptor when the donor element is exposed to imaging radiation that can be absorbed and converted into heat by the non-homogeneous light-to-heat conversion layer. The non-homogeneous light-to-heat conversion layer is provided so that, for a set of imaging conditions, improved imaging properties can be attained (such as a lower maximum temperature, improved imaging sensitivity, increased imaging fidelity, and decreased imaging defect formation) compared to an otherwise nearly identical donor element that includes a homogeneous light-to-heat conversion layer that has a thickness and optical density that are the about same as for the non-homogeneous light-to-heat conversion layer.

In still another embodiment, the present invention provides a method for improving the imaging properties of thermal mass transfer donor media by providing a substrate and a thermal transfer layer, and then forming a light-to-heat conversion layer between the substrate and the thermal transfer layer, the light-to-heat conversion layer having at least two regions exhibiting different absorption coefficients.

In yet another embodiment, the present invention provides a method of thermal mass transfer including the steps of providing a donor element that includes providing a donor element that has a thermal transfer layer and a light-to-heat conversion layer, the light-to-heat conversion layer having at least two regions exhibiting different absorption coefficients; placing the thermal transfer layer of the donor element adjacent to a receptor substrate; and thermally transferring portions of the thermal transfer layer from the donor element to the receptor substrate by selectively irradiating the donor element.

BRIEF DESCRIPTION OF THE DRAWINGS

The invention may be more completely understood in consideration of the following detailed description of various embodiments of the invention in connection with the accompanying drawings, in which.

Figure 1A:
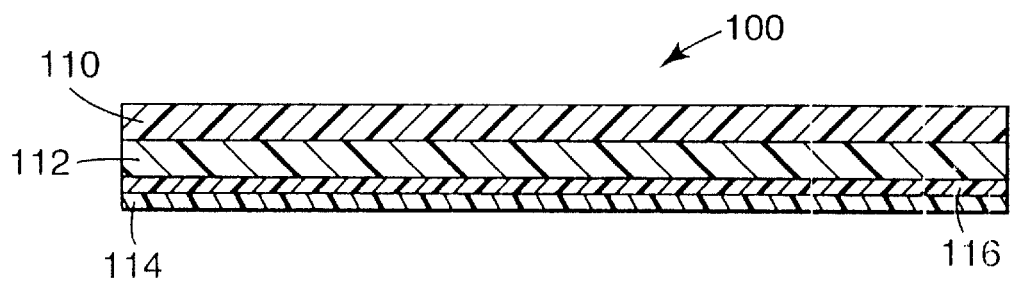
FIGS. 1(a)–(d) show various thermal mass transfer donor element constructions.
Figure 1B:
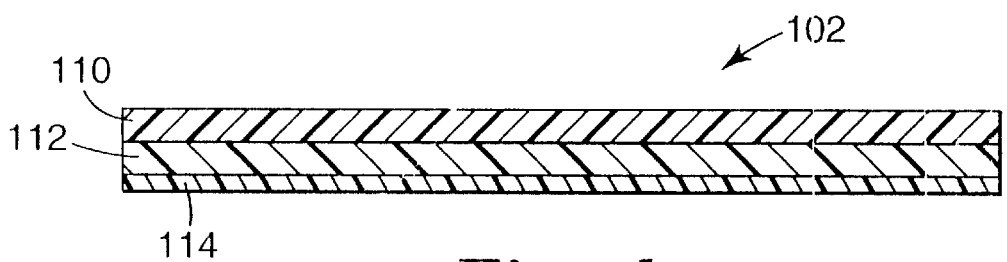

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be applicable to thermal mass transfer of materials from a donor element to a receptor. In particular, the present invention is directed to thermal mass transfer donor elements and methods of thermal mass transfer using donor elements that include an optional substrate, a light-to-heat conversion layer (LTHC layer), and a thermal transfer layer. The LTHC layer can be constructed according to the present invention to have a non-homogeneous distribution of absorber material (e.g., an absorber distribution that varies with thickness of the LTHC layer). Using a non-homogeneous LTHC layer can result in a lower maximum temperature attained in the LTHC layer and/or improved imaging properties (e.g., improved transfer sensitivity, decreased imaging defect formation, etc.) for a set of imaging conditions, for example as compared to a similar donor element that includes a homogeneous LTHC layer having a thickness and optical density about the same as for a non-homogeneous LTHC layer of the present invention. Fidelity refers to the correspondence between an intended transfer pattern and the actual pattern transferred, and can be approximated by comparing the dimensions of the transferred pattern with the intended dimensions, and/or by measuring the roughness of the edges of the transferred pattern, and/or by measuring the area covered by the transferred pattern and/or by measuring the surface topography of the transferred pattern.

Using the donor constructions and methods of the present invention can make it possible to manage temperatures and temperature distributions attained during imaging of thermal mass transfer donor media, as well as to control thermal transport between and within the layers of donor elements during imaging.

FIGS. 1(a)–(d) show examples of thermal mass transfer donor element constructions. While each of the donor constructions shown includes a substrate, the substrate is an optional component, and if included may or may not be removed before imaging. Donor element 100 includes a donor substrate 110, a LTHC layer 112, a thermal transfer layer 114, and an interlayer 116 disposed between the LTHC layer and the thermal transfer layer. Donor element 102 includes a donor substrate 110, a LTHC layer 112, and a thermal transfer layer 114. Donor element 104 includes a donor substrate 110, a LTHC layer 112, a thermal transfer layer 114, an interlayer 116 disposed between the LTHC layer and the thermal transfer layer, and an underlayer 118 disposed between the donor substrate and the LTHC layer. Donor element 106 includes a donor substrate 110, a LTHC layer 112, a thermal transfer layer 114, and an underlayer 118 disposed between the donor substrate and the LTHC layer. Each of the included components, the optional donor substrate 110, the optional underlayer 118, the LTHC layer 112, the optional interlayer 116, and the thermal transfer layer 114, are described in more detail in the discussion that follows.

Materials can be transferred from the transfer layer of a thermal mass transfer donor element (such as those shown in FIGS. 1(a)–(d)) to a receptor substrate by placing the transfer layer of the donor element adjacent to the receptor and irradiating the donor element with imaging radiation that can be absorbed by the LTHC layer and converted into heat. The donor can be exposed to imaging radiation through the donor substrate (or directly onto the LTHC layer if no donor substrate is used), or through the receptor, or both. The radiation can include one or more wavelengths, including visible light, infrared radiation, or ultraviolet radiation, for example from a laser, lamp, or other such radiation source. Material from the thermal transfer layer can be selectively transferred to a receptor in this manner to imagewise form patterns of the transferred material on the receptor. In many instances, thermal transfer using light from, for example, a lamp or laser, is advantageous because of the accuracy and precision that can often be achieved. The size and shape of the transferred pattern (e.g., a line, circle, square, or other shape) can be controlled by, for example, selecting the size of the light beam, the exposure pattern of the light beam, the duration of directed beam contact with the thermal mass transfer element, and/or the materials of the thermal mass transfer element. The transferred pattern can also be controlled by irradiating the donor element through a mask.

In addition, and as taught by the present invention, the shape of the transferred pattern and its fidelity to an intended pattern can be controlled by donor construction design, for example through the distribution and/or orientation of absorber material in one or more layers of the donor element, specifically through the distribution and/or orientation of absorber material within the light-to-heat conversion layer, and through relative thermal conductivity values and directionalities of the donor element layers.

The mode of thermal mass transfer can vary depending on the type of irradiation, the type of materials in the transfer layer, etc., and generally occurs via one or more mechanisms, one or more of which may be emphasized or de-emphasized during transfer depending on imaging conditions, donor constructions, and so forth. One mechanism of thermal transfer includes thermal melt-stick transfer whereby localized heating at the interface between the thermal transfer layer and the rest of the donor element can lower the adhesion of the thermal transfer layer to the donor in selected locations. Selected portions of the thermal transfer layer can adhere to the receptor more strongly than to the donor so that when the donor element is removed, the selected portions of the transfer layer remain on the receptor. Another mechanism of thermal transfer includes ablative transfer whereby localized heating can be used to ablate portions of the transfer layer off of the donor element, thereby directing ablated material toward the receptor. Yet another mechanism of thermal transfer includes sublimation whereby material dispersed in the transfer layer can be sublimated by heat generated in the donor element. A portion of the sublimated material can condense on the receptor. The present invention contemplates transfer modes that include one or more of these and other mechanisms whereby the heat generated in an LTHC layer of a thermal mass transfer donor element can be used to cause the transfer of materials from a transfer layer to receptor surface.

A variety of radiation-emitting sources can be used to heat thermal mass transfer donor elements. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power ($\geq 100$ mW) single mode laser diodes, fibercoupled laser diodes, and diode-pumped solid state lasers (e.g., Nd:YAG and Nd:YLF). Laser exposure dwell times can vary widely from, for example, a few hundredths of microseconds to tens of microseconds or more, and laser fluences can be in the range from, for example, about 0.01 to about 5 J/cm$^2$ or more. Other radiation sources and irradiation conditions can be suitable based on, among other things, the donor element construction, the transfer layer material, the mode of thermal mass transfer, and other such factors.

When high spot placement accuracy is required (e.g., for high information full color display applications) over large substrate areas, a laser is particularly useful as the radiation source. Laser sources are also compatible with both large rigid substrates (e.g., 1 m×1 m×1.1 mm glass) and continuous or sheeted film substrates (e.g., 100 μm polyimide sheets).

During imaging, the thermal mass transfer element can be brought into intimate contact with a receptor (as might typically be the case for thermal melt-stick transfer mechanisms) or the thermal mass transfer element can be spaced some distance from the receptor (as can be the case for ablative transfer mechanisms or transfer material sublimation mechanisms). In at least some instances, pressure or vacuum can be used to hold the thermal transfer element in intimate contact with the receptor. In some instances, a mask can be placed between the thermal transfer element and the receptor. Such a mask can be removable or can remain on the receptor after transfer. A radiation source can then be used to heat the LTHC layer (and/or other layer(s) containing radiation absorber) in an imagewise fashion (e.g., digitally or by analog exposure through a mask) to perform imagewise transfer and/or patterning of the transfer layer from the thermal transfer element to the receptor.

Typically, selected portions of the transfer layer are transferred to the receptor without transferring significant portions of the other layers of the thermal mass transfer element, such as the optional interlayer or the LTHC layer. The presence of the optional interlayer may eliminate or reduce the transfer of material from the LTHC layer to the receptor and/or reduce distortion in the transferred portion of the transfer layer. Preferably, under imaging conditions, the adhesion of the optional interlayer to the LTHC layer is greater than the adhesion of the interlayer to the transfer layer. In some instances, a reflective interlayer can be used to attenuate the level of imaging radiation transmitted through the interlayer and reduce any damage to the transferred portion of the transfer layer that may result from interaction of the transmitted radiation with the transfer layer and/or the receptor. This is particularly beneficial in reducing thermal damage which may occur when the receptor is highly absorptive of the imaging radiation.

During laser exposure, it may be desirable to minimize formation of interference patterns due to multiple reflections from the imaged material. This can be accomplished by various methods. The most common method is to effectively roughen the surface of the thermal transfer element on the scale of the incident radiation as described in U.S. Pat. No. 5,089,372. This has the effect of disrupting the spatial coherence of the incident radiation, thus minimizing self interference. An alternate method is to employ an antireflection coating within the thermal transfer element. The use of anti-reflection coatings is known, and may consist of quarter-wave thicknesses of a coating such as magnesium fluoride, as described in U.S. Pat. No. 5,171,650.

Large thermal transfer elements can be used, including thermal transfer elements that have length and width dimensions of a meter or more. In operation, a laser can be rastered or otherwise moved across the large thermal transfer element, the laser being selectively operated to illuminate portions of the thermal transfer element according to a desired pattern. Alternatively, the laser may be stationary and the thermal transfer element and/or receptor substrate moved beneath the laser.

In some instances, it may be necessary, desirable, and/or convenient to sequentially use two or more different thermal transfer elements to form a device, such as an optical display. For example, a black matrix may be formed, followed by the thermal transfer of a color filter in the windows of the black matrix. As another example, a black matrix may be formed, followed by the thermal transfer of one or more layers of a thin film transistor. As another example, multiple layer devices can be formed by transferring separate layers or separate stacks of layers from different thermal transfer elements. Multilayer stacks can also be transferred as a single transfer unit from a single donor element. Examples of multilayer devices include transistors such as organic field effect transistors (OFETs), organic electroluminescent pixels and/or devices, including organic light emitting diodes (OLEDs). Multiple donor sheets can also be used to form separate components in the same layer on the receptor. For example, three different color donors can be used to form color filters for a color electronic display. Also, separate donor sheets, each having multiple layer transfer layers, can be used to pattern different multilayer devices (e.g., OLEDs that emit different colors, OLEDs and OFETs that connect to form addressable pixels, etc.). A variety of other combinations of two or more thermal transfer elements can be used to form a device, each thermal transfer element forming one or more portions of the device. It will be understood other portions of these devices, or other devices on the receptor, may be formed in whole or in part by any suitable process including photolithographic processes, ink jet processes, and various other printing or mask-based processes.

Referring back to the donor constructions shown in FIGS. 1(a)–(d), various layers of thermal mass transfer donor elements of the present invention will now be described.

Optional donor substrate 110 can be a polymer film. One suitable type of polymer film is a polyester film, for example, polyethylene terephthalate or polyethylene naphthalate films. However, other films with sufficient optical properties, including high transmission of light at a particular wavelength, as well as sufficient mechanical and thermal stability for the particular application, can be used. The donor substrate, in at least some instances, is flat so that uniform coatings can be formed. The donor substrate is also typically selected from materials that remain stable despite heating of the LTHC layer. The typical thickness of the donor substrate ranges from 0.025 to 0.15 mm, preferably 0.05 to 0.1 mm, although thicker or thinner donor substrates may be used.

The materials used to form the donor substrate and the adjacent layer (e.g., an underlayer or a LTHC layer) can be selected to improve adhesion between the donor substrate and the adjacent layer, to control temperature transport between the substrate and the adjacent layer, to control imaging radiation transport to the LTHC layer, and the like. An optional priming layer can be used to increase uniformity during the coating of subsequent layers onto the substrate and also increase the bonding strength between the donor substrate and adjacent layers. One example of a suitable substrate with primer layer is available from Teijin Ltd. Product No. HPE100, Osaka, Japan).

Figure 1C:
Figure 1D:
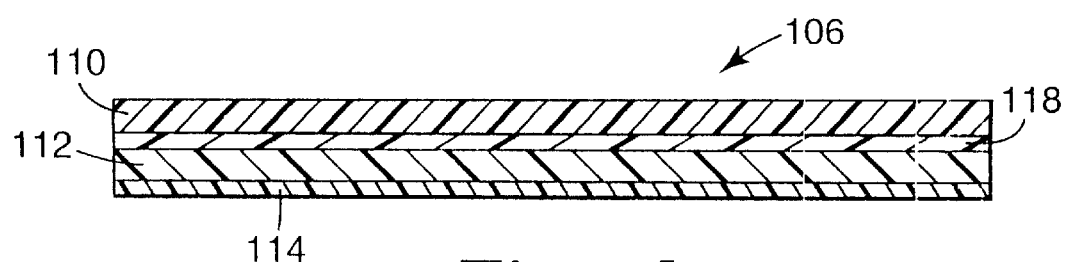

An optional underlayer 118 (as shown in FIGS. 1(c) and (d)) may be coated or otherwise disposed between a donor substrate and the LTHC layer, for example to minimize damage, such as thermal damage, to the donor substrate during imaging. The underlayer can also influence adhesion of the LTHC layer to the donor substrate element. Typically, the underlayer has high thermal resistance (i.e., has a lower thermal conductivity than the substrate) and acts as a thermal insulator to protect the substrate from heat generated in the LTHC layer. Alternatively, an underlayer that has a higher thermal conductivity than the substrate can be used to enhance heat transport from the LTHC layer to the substrate, for example to reduce the occurrence of imaging defects that can be caused by LTHC layer overheating.

Suitable underlayers include, for example, polymer films, metal layers (e.g., vapor deposited metal layers), inorganic layers (e.g., sol-gel deposited layers and vapor deposited layers of inorganic oxides (e.g., silica, titania, aluminum oxide and other metal oxides)), and organic/inorganic composite layers. Organic materials suitable as underlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the donor substrate or LTHC layer as, for example, thermoplastic precursors and subsequently crosslinked to form a crosslinked underlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (for example, solvent coating, spray coating, or extrusion coating). Typically, the glass transition temperature ($T_g$) of thermoplastic materials suitable for use in the underlayer is 25° C. or greater, preferably 50° C. or greater, more preferably 100° C. or greater, and, most preferably, 150° C. or greater. In some embodiments, the underlayer includes a thermoplastic material that has a $T_g$ greater than any temperature attained in the transfer layer during imaging. The underlayer may be either transmissive, absorbing, reflective, or some combination thereof, to one or more wavelengths of imaging radiation.

Inorganic materials suitable as underlayer materials include, for example, metals, metal oxides, metal sulfides, and inorganic carbon coatings, including those materials that are transmissive, absorptive, or reflective at the imaging light wavelength. These materials may be coated or otherwise applied via conventional techniques (e.g., vacuum sputtering, vacuum evaporation, or plasma jet deposition).

The underlayer may provide a number of benefits. For instance, the underlayer may be used to manage or control heat transport between the LTHC layer and the donor substrate. An underlayer may be used to insulate the substrate from heat generated in the LTHC layer or to transport heat away from the LTHC layer toward the substrate. It will be appreciated from the teaching of the present invention that temperature management and heat transport in the donor element can be accomplished by adding layers and/or by controlling layer properties such as thermal conductivity (e.g., either or both the value and the directionality of thermal conductivity), distribution and/or orientation of absorber material, the morphology of layers or particles within layers (for example, the orientation of crystal growth or grain formation in metallic thin film layers or particles), and the like.

The underlayer may contain additives, including, for example, photoinitiators, surfactants, pigments, plasticizers, and coating aids. The thickness of the underlayer may depend on factors such as, for example, the material of the underlayer, the material and optical properties of the LTHC layer, the material of the donor substrate, the wavelength of the imaging radiation, the duration of exposure of the thermal transfer element to imaging radiation, and the overall donor element construction. For a polymeric underlayer, the thickness of the underlayer typically is in the range of 0.05 $\mu$m to 10 $\mu$m, preferably, from about 0.1 $\mu$m to 4 $\mu$m, more preferably, 0.5 to 3 $\mu$m, and, most preferably, 0.8 to 2 $\mu$m. For inorganic underlayers (e.g., metal or metal compound underlayer), the thickness of the underlayer typically is in the range of 0.005 $\mu$m to 10 $\mu$m, preferably, from about 0.01 $\mu$m to 4 $\mu$m, and, more preferably, from about 0.02 to 2 $\mu$m.

Referring again to FIGS. 1(a)–(d), an LTHC layer 112 can be included in thermal mass transfer elements of the present invention to couple irradiation energy into the thermal transfer element. The LTHC layer preferably includes a radiation absorber that absorbs incident radiation (e.g., laser light) and converts at least a portion of the incident radiation into heat to enable transfer of the transfer layer from a the thermal transfer element to the receptor.

According to the present invention, LTHC layers can have a non-homogeneous distribution of absorber material, for example to control a maximum temperature attained in the donor element and/or to control a temperature attained at the transfer layer interface. For example, an LTHC layer can have absorber material distribution that is less dense closer to the donor substrate and more dense closer to the transfer layer. In many instances, such a design can cause more radiation to be absorbed and converted into heat deeper into the LTHC layer as compared to a homogeneous LTHC layer having the same thickness and optical density. For the sake of clarity, the term "depth" when used to describe a position in the LTHC layer means distance into the LTHC layer in the thickness dimension as measured from the donor substrate side of the thermal mass transfer element. In other instances, it may be beneficial to have a LTHC layer having an absorber material distribution that is more dense closer to the donor substrate and less dense closer to the transfer layer. Other examples of LTHC constructions are discussed in more detail below.

Generally, the radiation absorber(s) in the LTHC layer absorb light in the infrared, visible, and/or ultraviolet regions of the electromagnetic spectrum and convert the absorbed radiation into heat. The radiation absorber materials are typically highly absorptive of the selected imaging radiation, providing an LTHC layer with an optical density at the wavelength of the imaging radiation in the range of about 0.2 to 3 or higher. Optical density is the absolute value of the logarithm (base 10) of the ratio of a) the intensity of light transmitted through the layer and b) the intensity of light incident on the layer.

Suitable radiation absorbing materials can include, for example, dyes (e.g., visible dyes, ultraviolet dyes, infrared dyes, fluorescent dyes, and radiation-polarizing dyes), pigments, metals, metal compounds, metal films, and other suitable absorbing materials. Examples of suitable radiation absorbers includes carbon black, metal oxides, and metal sulfides. One example of a suitable LTHC layer can include a pigment, such as carbon black, and a binder, such as an organic polymer. Another suitable LTHC layer includes metal or metal/metal oxide formed as a thin film, for example, black aluminum (i.e., a partially oxidized aluminum having a black visual appearance). Metallic and metal compound films may be formed by techniques, such as, for example, sputtering and evaporative deposition. Particulate coatings may be formed using a binder and any suitable dry or wet coating techniques. LTHC layers can also be formed by combining two or more LTHC layers containing similar or dissimilar materials. For example, an LTHC layer can be formed by vapor depositing a thin layer of black aluminum over a coating that contains carbon black disposed in a binder.

Dyes suitable for use as radiation absorbers in a LTHC layer may be present in particulate form, dissolved in a binder material, or at least partially dispersed in a binder material. When dispersed particulate radiation absorbers are used, the particle size can be, at least in some instances, about 10 $\mu$m or less, and may be about 1 $\mu$m or less. Suitable dyes include those dyes that absorb in the IR region of the spectrum. For example, IR absorbers marketed by Glendale Protective Technologies, Inc., Lakeland, Fla., under the designation CYASORB IR-99, IR-126 and IR-165 may be used. A specific dye may be chosen based on factors such as, solubility in, and compatibility with, a specific binder and/or coating solvent, as well as the wavelength range of absorption.

Pigmentary materials may also be used in the LTHC layer as radiation absorbers. Examples of suitable pigments include carbon black and graphite, as well as phthalocyanines, nickel dithiolenes, and other pigments described in U.S. Pat. Nos. 5,166,024 and 5,351,617, incorporated herein by reference. Additionally, black azo pigments based on copper or chromium complexes of for example, pyrazolone yellow, dianisidine red, and nickel azo yellow can be useful. Inorganic pigments can also be used, including, for example, oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-structured oxides, and oxides structurally related to the bronze family (e.g., $WO_{2.9}$) may also be used.

Metal radiation absorbers may be used, either in the form of particles, as described for instance in U.S. Pat. No. 4,252,671, incorporated herein by reference, or as films, as disclosed in U.S. Pat. No. 5,256,506, incorporated herein by reference. Suitable metals include, for example, aluminum, bismuth, tin, indium, tellurium and zinc. Metal radiation absorbers that are magnetic may also be useful. Magnetic particles may be used as radiation absorbers in cases where a magnetic field might be used to orient magnetic particles, for example, or to non-uniformly distribute magnetic particles in a binder that may be hardened to fix the positions of the particles to form a non-homogeneous LTHC layer. For example, elongated or acicular magnetic particles can be used that have long dimensions that are smaller, but on the order of, the thickness of the LTHC layer, and that are oriented with their long dimension along the thickness direction of the LTHC layer. Other orientations and distributions can be used.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, and polycarbonates. Suitable binders may include monomers, oligomers, or polymers that have been, or can be, polymerized or crosslinked. Additives such as photoinitiators may also be included to facilitate crosslinking of the LTHC binder. In some embodiments, the binder is primarily formed using a coating of crosslinkable monomers and/or oligomers with optional polymer.

The inclusion of a thermoplastic resin (e.g., polymer) may improve, in at least some instances, the performance (e.g., transfer properties and/or coatability) of the LTHC layer. It is thought that a thermoplastic resin may improve the adhesion of the LTHC layer to the donor substrate. In one embodiment, the binder includes 25 to 50 wt. % (excluding the solvent when calculating weight percent) thermoplastic resin, and, preferably, 30 to 45 wt. % thermoplastic resin, although lower amounts of thermoplastic resin may be used (e.g., 1 to 15 wt. %). The thermoplastic resin is typically chosen to be compatible (i.e., form a one-phase combination) with the other materials of the binder. A solubility parameter can be used to indicate compatibility, *Polymer Handbook*, J. Brandrup, ed., pp. VII 519–557 (1989), incorporated herein by reference. In at least some embodiments, a thermoplastic resin that has a solubility parameter in the range of 9 to 13 $(cal/cm^3)^{1/2}$, preferably, 9.5 to 12 $(cal/cm^3)^{1/2}$, is chosen for the binder. Examples of suitable thermoplastic resins include polyacrylics, styrene-acrylic polymers and resins, and polyvinyl butyral.

Conventional coating aids, such as surfactants and dispersing agents, may be added to facilitate the coating process. The LTHC layer may be coated onto the donor substrate using a variety of coating methods known in the art. A polymeric or organic LTHC layer is coated, in at least some instances, to a thickness of 0.05 $\mu$m to 20 $\mu$m, preferably, 0.5 $\mu$m to 10 $\mu$m, and, more preferably, 1 $\mu$m to 7 $\mu$m. An inorganic LTHC layer is coated, in at least some instances, to a thickness in the range of 0.0005 to 10 $\mu$m, and preferably, 0.001 to 1 $\mu$m.

According to the present invention, thermal mass transfer donor elements can include a non-homogeneous LTHC layer. For example, the LTHC layer can have a distribution of absorber material that varies with thickness. In particular, the LTHC layer can have an absorber density that increases with increasing depth. More generally, the LTHC layer can be designed to have a varying absorption coefficient by varying the distribution or density of the same absorber material throughout the LTHC layer, or by including different absorber materials or layers in different locations in the LTHC layer, or both. For the purposes of the present disclosure, the term non-homogeneous includes anisotropic thermal properties or distributions of material(s) in at least one direction in the LTHC layer.

Absorption coefficient is proportional to the rate of absorption of imaging radiation in the LTHC layer. For a homogeneous LTHC layer, the absorption coefficient is constant through the thickness, and the optical density of the LTHC layer is approximately proportional to the total thickness of the LTHC layer multiplied by the absorption coefficient. For non-homogeneous LTHC layers, the absorption coefficient can vary, complicating the calculation of an optical density. Exemplary non-homogeneous LTHC layers have an absorption coefficient that varies as a function of thickness of the LTHC layer, and the optical density with depend on the integral of the absorption coefficient taken over the entire LTHC thickness range.

A non-homogeneous LTHC layer can also have an absorption coefficient that varies in the plane of the layer. Additionally, absorber material can be oriented or non-uniformly dispersed in the plane of the LTHC layer to achieve an anisotropic thermal conductivity (e.g., acicular magnetic particles can be used as absorber particles and can be oriented in the presence of a magnetic field). In this way, an LTHC layer can be made that conducts thermal energy efficiently through the thickness of the layer to transport heat to the transfer layer while having poor thermal conductivity in the plane of the layer so that less heat is dissipated into adjacent, cooler areas, for example those areas that have not been exposed to imaging radiation. Such an anisotropic thermal conductivity might be used to enhance the resolution of thermal patterning using donor elements of the present invention.

Likewise, any of the other layers of a thermal mass transfer donor element (e.g., substrate, underlayer, interlayer, and/or thermal transfer layer) can be made to have anisotropic thermal conductivities to control heat transport to or away from other layers. One way to make layers having anisotropic thermal conductivities is to have an anisotropic orientation or distribution of materials in the layer, the materials having different thermal conductivities. Another way is impart a surface of one or more layers with a physical structure (e.g., to make a layer thinner in some spots and thicker in others).

By designing LTHC layers to have an absorption coefficient that varies with layer thickness, imaging performance of the donor element can be enhanced. For example, the LTHC layer can be designed so that the maximum temperature attained in the donor element is lowered and/or the transfer temperature (i.e., temperature attained at the transfer layer/LTHC interface or transfer layer/interlayer interface) is raised, relative to a homogeneous LTHC layer that has the same thickness and optical density. Advantages can include the ability to use imaging conditions that can lead to improved transfer properties (e.g., transfer sensitivity) without damaging the donor element or transferred pattern due to overheating of the donor.

In exemplary embodiments, thermal mass transfer donor elements of the present invention include an LTHC layer that has an absorption coefficient that varies with thickness. Such an LTHC layer can be made by any suitable technique. For example, two or more layers can be sequentially coated, laminated, extruded, or otherwise formed, each of the layers having a different absorption coefficient, thereby forming an overall non-homogeneous LTHC layer. The boundaries between the layers can be gradual (e.g., due to diffusion between the layers) or abrupt. Non-homogeneous LTHC layers can also be made by diffusing material into a previously formed layer to create an absorption coefficient that varies with thickness. Examples include diffusing an absorber material into a binder, diff-using oxygen into a thin aluminum layer, and the like.

Suitable methods for making non-homogeneous LTHC layers include, but are not limited to: (i) sequentially coating two or more layers that have absorber material dispersed in a crosslinkable binder, each layer having a different absorption coefficient, and either crosslinking after each coating step or crosslinking multiple layers together after coating all the pertinent layers; (ii) sequentially vapor depositing two or more layers that have different absorption coefficients; (iii) sequentially forming two or more layers that have different absorption coefficients, at least one of the layers including an absorber material disposed in a crosslinkable binder and at least one of the layers being vapor deposited, where the crosslinkable binder may be crosslinked immediately after coating that particular layer or after other coating steps are performed; (iv) sequentially extruding one or more layers, each layer having an absorber material disposed in a binder; (v) extruding a multiple layer stack of at least two layers, at least two of the layers having absorber material dispersed therein to have different absorption coefficients; and (vi) any suitable combination or permutation of the above. Examples of non-homogeneous LTHC layers that can be made include a two-layer structure that has a higher absorption coefficient in a deeper region, a two-layer structure that has a lower absorption coefficient in a deeper region, a three-layer structure that has an absorption coefficient that becomes sequentially larger with depth, a three-layer structure that has an absorption coefficient that becomes sequentially smaller with depth, a three-layer structure that has an absorption coefficient that becomes larger and then smaller with increasing depth, a three-layer structure that has an absorption coefficient that becomes smaller and then larger with increasing depth, and so on depending on the desired number of layers. With increasing numbers of regions having different absorption coefficients, and/or with thinner regions, and/or with increased diffusion between regions, a non-homogeneous LTHC layer can be formed that approximates a continuously varying absorption coefficient.

Figure 2A:
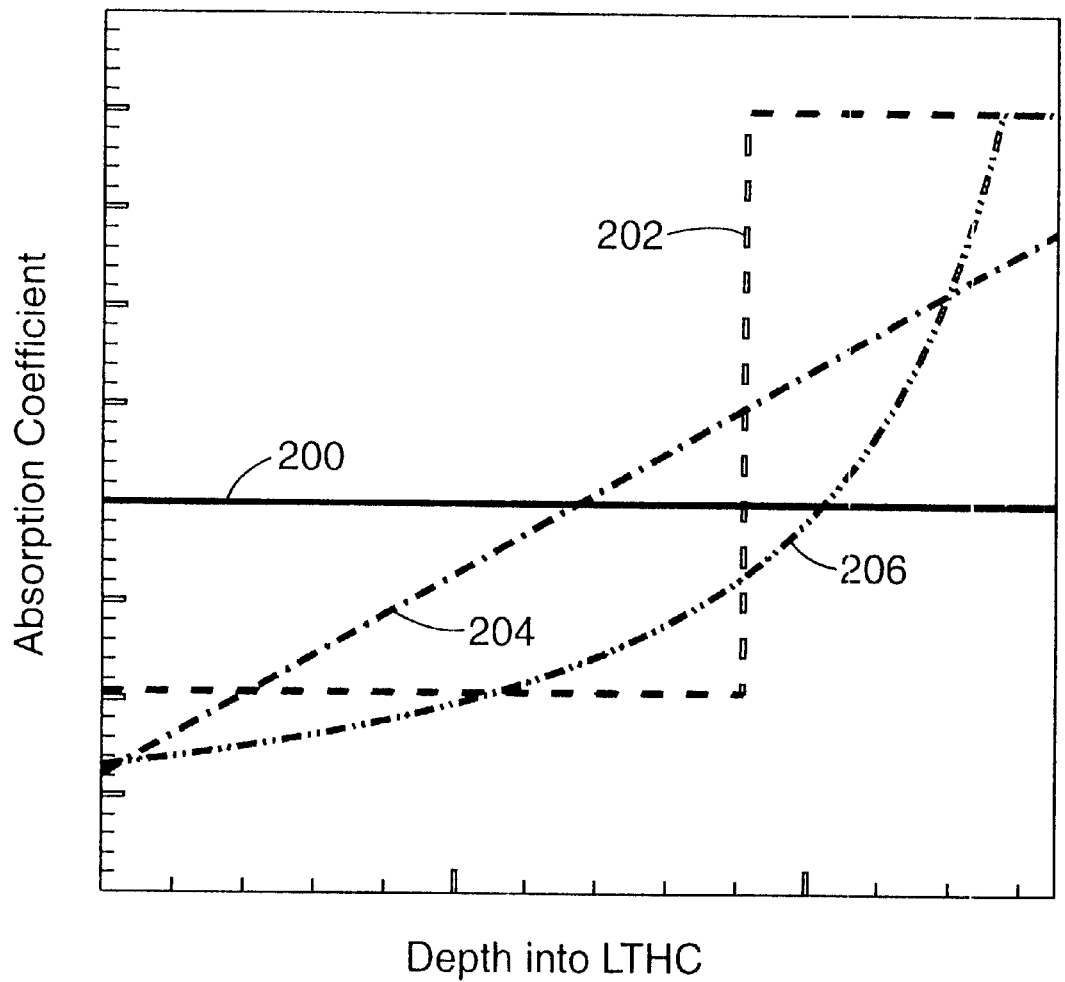
FIG. 2(a) is a plot showing absorption coefficient profiles as a function of depth for various light-to-heat conversion layers.

FIG. 2 compares power absorption and temperature rise for four donor elements having LTHC layers of the same thickness and overall optical density (at the imaging wavelength) but different absorption coefficient profiles. FIG. 2(a) shows the absorption coefficient profiles for the four LTHC layers. One donor has a homogeneous LTHC profile 200, another donor has a step-up (or dual layer) LTHC profile 202 such that the absorption coefficient is constant at a lower level up to a certain thickness and then constant at a higher level thereafter, another donor has a linearly increasing LTHC profile 204, and a final donor has a generally exponentially increasing LTHC profile 206 that flattens out at the deepest portion of the LTHC layer in order to give an optical density that is the same as the other three donors, and to keep absorber loading levels within coatable limits.

Figure 2B:
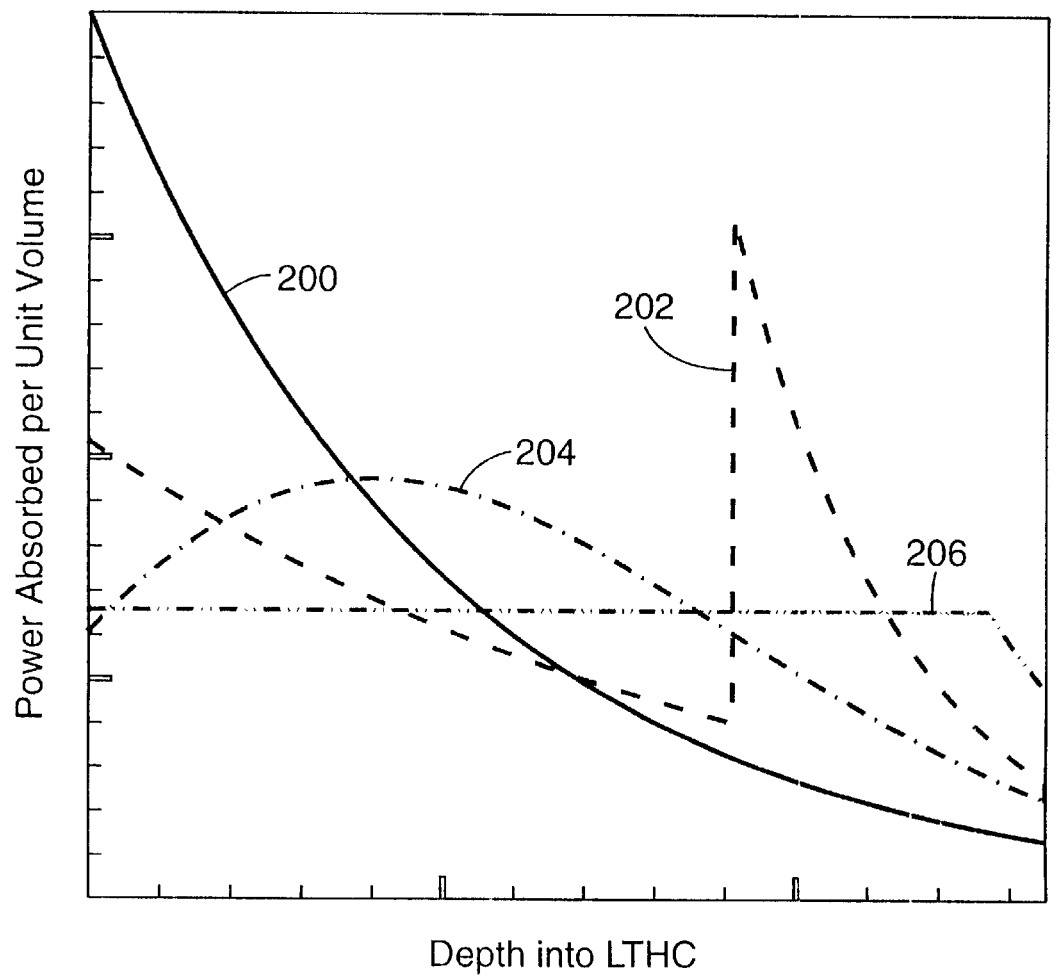
FIG. 2(b) is a plot showing relative power absorbed per unit volume as a function of depth during imaging of the light-to-heat conversion layers depicted in FIG. 2(a)

FIG. 2(b) shows the power absorbed per unit volume as a function of depth for each of the four LTHC layer profiles 200, 202, 204, and 206, respectively, where the donor sheet is being irradiated from the shallow side of the LTHC layer. The power absorbed by the homogeneous LTHC layer decreases continuously with depth into the LTHC layer. The power absorbed by the dual layer LTHC layer decreases continuously with depth until it reaches a sharp increase at the depth were the absorption coefficient changes, and then the power absorbed again decreases from this sharp increase. The power absorbed by the linear LTHC layer increases to a maximum at some depth and then decreases through the remaining thickness. The power absorbed by the exponential LTHC layer remains constant throughout most of the LTHC layer until decreasing at the depth where the absorption coefficient profile flattens out. As can be observed from FIG. 2(b), the power absorption profiles for each of the non-homogeneous LTHC layers have a lower maximum than for the homogeneous LTHC layer, as well as a higher minimum than for the homogeneous LTHC layer. This result translates into the temperature profiles shown in FIG. 2(c).

Figure 2C:
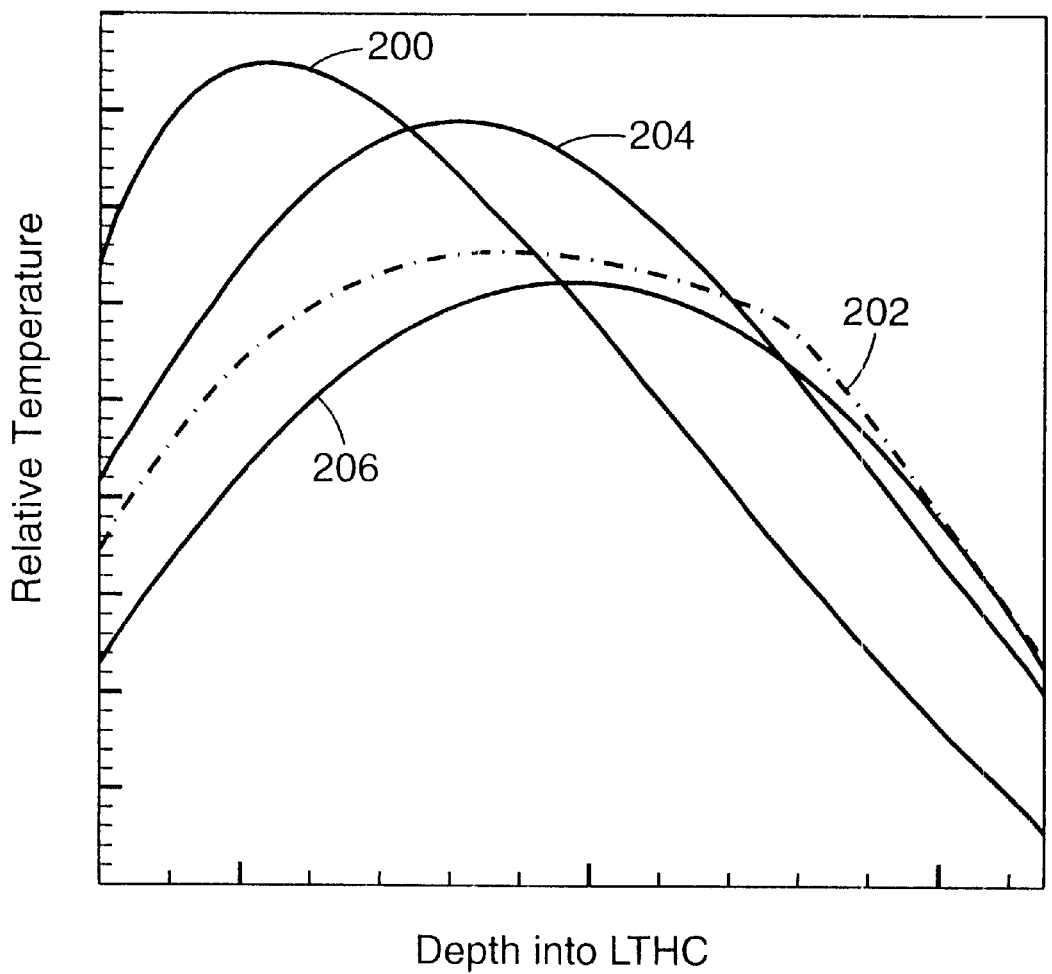
FIG. 2(c) is a plot showing relative temperature profiles as a function of depth during imaging of the light-to-heat conversion layers depicted in FIG. 2(a)

FIG. 2(c) shows the relative temperature attained as a function of depth for each of the four LTHC layer profiles 200, 202, 204, and 206, respectively as they are being irradiated from the shallow side of the LTHC layer. As can be seen, the maximum temperatures observed for each of the non-homogeneous LTHC layers (indicated by 202, 204, and 206) are lower than the maximum temperature observed in the homogeneous LTHC layer (indicated by 200). Additionally, FIG. 2(c) gives information about the transfer temperature that can be achieved. The transfer temperature is governed, at least in part, by the heat generated at the deepest portions of the LTHC layer. FIG. 2(c) demonstrates that the heat generated at the deepest portions for the non-homogeneous LTHC layers is higher than that for the non-homogeneous LTHC layer. Thus, in general, non-homogeneous LTHC layers that have an absorption coefficient that increases with depth can be used to lower a maximum temperature attained in the LTHC layer and to increase the donor element transfer temperature when the donor element is irradiated from the shallow side of the LTHC layer.

An advantage to decreasing a maximum temperature in the donor element can be the reduction in defects caused by thermal decomposition or overheating of the LTHC layer (or other layers). Such defects can include distortion of the transferred image (for example due to distortion or transparentization of the LTHC layer from excessive heat during imaging), undesired transfer of portions of the LTHC layer to the receptor, unintended fragmentation of the transferred image, increased surface roughness of the transferred image (for example due to mechanical distortion of one or more layers due to overheating of the donor element during imaging), and the like. For convenience, such defects will be referred to collectively as imaging defects. Another advantage to designing LTHC layers according to the present invention is that higher power radiation sources and/or longer dwell times (e.g., higher laser doses) can be used to raise the transfer temperature, thereby increasing the transfer fidelity, while still not exceeding a temperature in the LTHC layer that might lead to imaging defects.

Referring again to FIGS. 1(a) and (c), an optional interlayer 116 may be disposed between the LTHC layer 112 and transfer layer 114, as shown for donor constructions 100 and 104. The interlayer can be used, for example, to minimize damage and contamination of the transferred portion of the transfer layer and may also reduce distortion in the transferred portion of the transfer layer. The interlayer may also influence the adhesion of the transfer layer to the rest of the thermal transfer donor element. Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer layer.

Suitable interlayers include, for example, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Organic materials suitable as interlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer as, for example, thermoplastic precursors and subsequently crosslinked to form a crosslinked interlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (for example, solvent coating, spray coating, or extrusion coating). Typically, the glass transition temperature ($T_g$) of thermoplastic materials suitable for use in the interlayer is 25° C. or greater, preferably 50° C. or greater, more preferably 100° C. or greater, and, most preferably, 150° C. or greater. The interlayer may be either transmissive, absorbing, reflective, or some combination thereof, at the imaging radiation wavelength.

Inorganic materials suitable as interlayer materials include, for example, metals, metal oxides, metal sulfides, and inorganic carbon coatings, including those materials that are highly transmissive or reflective at the imaging light wavelength. These materials may be applied to the light-to-heat conversion layer via conventional techniques (e.g., vacuum sputtering, vacuum evaporation, or plasma jet deposition).

The interlayer may provide a number of benefits. The interlayer may be a barrier against the transfer of material from the light-to-heat conversion layer. It may also modulate the temperature attained in the transfer layer so that thermally unstable and/or temperature sensitive materials can be transferred. For example, the interlayer can act as a thermal diffuser to control the temperature at the interface between the interlayer and the transfer layer relative to the temperature attained in the LTHC layer. This may improve the quality (i.e., surface roughness, edge roughness, etc.) of the transferred layer. The presence of an interlayer may also result in improved plastic memory or decreased distortion in the transferred material.

The interlayer may contain additives, including, for example, photoinitiators, surfactants, pigments, plasticizers, and coating aids. The thickness of the interlayer may depend on factors such as, for example, the material of the interlayer, the properties of the LTHC layer, the properties of the transfer layer, the wavelength of the imaging radiation, and the duration of exposure of the thermal transfer element to imaging radiation. For polymer interlayers, the thickness of the interlayer typically is in the range of 0.05 $\mu$m to 10 $\mu$m. For inorganic interlayers (e.g., metal or metal compound interlayers), the thickness of the interlayer typically is in the range of 0.005 $\mu$m to 10 $\mu$m.

Referring again to FIGS. 1(a)–(d), a thermal transfer layer 114 is included in thermal mass transfer donor elements of the present invention. Transfer layer 114 can include any suitable material or materials, disposed in one or more layers with or without a binder, that can be selectively transferred as a unit or in portions by any suitable transfer mechanism when the donor element is exposed to imaging radiation that can be absorbed by the LTHC layer and converted into heat.

Examples of transfer layers that can be selectively patterned from thermal mass transfer donor elements include transfer layers which include colorants (e.g., pigments and/or dyes dispersed or dissolved in a binder), polarizers, liquid crystal materials, particles (e.g., spacers for liquid crystal displays, magnetic particles, insulating particles, conductive particles), emissive materials (e.g., phosphors and/or organic electroluminescent materials), hydrophobic materials (e.g., partition banks for ink jet receptors), hydrophilic materials, multilayer stacks (e.g., multilayer device constructions such as organic electroluminescent devices), microstructured or nanostructured layers, photoresist, metals, polymer containing layers, adhesives, binders, enzymes or other bio-materials, or other suitable materials or combination of materials. These and other transfer layers are disclosed in the following documents: U.S. Pat. Nos. 5,725,989; 5,710,097; 5,693,446; 5,691,098; 5,685,939; and 5,521,035; International Publication Nos. WO 97/15173, WO 98/03346, and WO 99/46961; and co-assigned U.S. patent application Ser. Nos. 09/231,724; 09/312,504; 09/312,421; and 09/392,386.

Particularly well suited transfer layers include materials that are useful in display applications. Thermal mass transfer according to the present invention can be performed to pattern one or more materials on a receptor with high precision and accuracy using fewer processing steps than for photolithography-based patterning techniques, and thus can be especially useful in applications such as display manufacture. For example, transfer layers can be made so that, upon thermal transfer to a receptor, the transferred materials form color filters, black matrix, spacers, barriers, partitions, polarizers, retardation layers, wave plates, organic conductors or semi-conductors, inorganic conductors or semi-conductors, organic electroluminescent layers, phosphor layers, organic electroluminescent devices, organic transistors, and other such elements, devices, or portions thereof that can be useful in displays, alone or in combination with other elements that may or may not be patterned in a like manner.

The receptor substrate may be any item suitable for a particular application including, but not limited to, glass, transparent films, reflective films, metals, semiconductors, various papers, and plastics. For example, receptor substrates may be any type of substrate or display element suitable for display applications. Receptor substrates suitable for use in displays such as liquid crystal displays or emissive displays include rigid or flexible substrates that are substantially transmissive to visible light. Examples of rigid receptor substrates include glass, indium tin oxide coated glass, low temperature polysilicon (LTPS), and rigid plastic. Suitable flexible substrates include substantially clear and transmissive polymer films, reflective films, non-bireflingent films, transflective films, polarizing films, multilayer optical films, and the like. Suitable polymer substrates include polyester base (e.g., polyethylene terephthalate, polyethylene naphthalate), polycarbonate resins, polyolefin resins, polyvinyl resins (e.g., polyvinyl chloride, polyvinylidene chloride, polyvinyl acetals, etc.), cellulose ester bases (e.g., cellulose triacetate, cellulose acetate), and other conventional polymeric films used as supports in various imaging arts. Transparent polymeric film base of 2 to 100 mils (i.e., 0.05 to 2.54 mm) is preferred.

For glass receptor substrates, a typical thickness is 0.2 to 2.0 mm. It is often desirable to use glass substrates that are 1.0 mm thick or less, or even 0.7 mm thick or less. Thinner substrates result in thinner and lighter weight displays. Certain processing, handling, and assembling conditions, however, may suggest that thicker substrates be used. For example, some assembly conditions may require compression of the display assembly to fix the positions of spacers disposed between the substrates. The competing concerns of thin substrates for lighter displays and thick substrates for reliable handling and processing can be balanced to achieve a preferred construction for particular display dimensions.

If the receptor substrate is a polymeric film, it may be preferred that the film be non-birefringent to substantially prevent interference with the operation of the display in which it is to be integrated, or it may be preferred that the film be birefringent to achieve desired optical effects. Exemplary non-birefringent receptor substrates are polyesters that are solvent cast. Typical examples of these are those derived from polymers consisting or consisting essentially of repeating, interpolymerized units derived from 9,9-bis-(4-hydroxyphenyl)-fluorene and isophthalic acid, terephthalic acid or mixtures thereof, the polymer being sufficiently low in oligomer (i.e., chemical species having molecular weights of about 8000 or less) content to allow formation of a uniform film. This polymer has been disclosed as one component in a thermal transfer receiving element in U.S. Pat. No. 5,318,938. Another class of non-birefringent substrates are amorphous polyolefins (e.g., those sold under the trade designation Zeonexm from Nippon Zeon Co., Ltd.). Exemplary birefringent polymeric receptors include multilayer polarizers or mirrors such as those disclosed in U.S. Pat. Nos. 5,882,774 and 5,828,488, and in International Publication No. WO 95/17303.

EXAMPLES

Example 1

Color Donor Elements

Two color donor elements were made, each having an overall construction such as construction 100 shown in FIG. 1(a). The first color donor sheet, Color Donor 1, had a non-homogeneous LTHC layer, and the second color donor sheet, Color Donor 2, had a homogeneous LTHC layer. Color Donor 2 was used as a comparative example.

Color Donor 1: Non-homogeneous LTHC Layer

Color Donor 1 was prepared in the following manner. A first LTHC solution, given in Table I, was coated onto a 0.1 mm thick polyethylene terapthalate (ET) film substrate. Coating was performed using a Yasui Seiki Lab Coater, Model CAG-150, using a microgravure roll with 150 helical cells per lineal inch. The first LTHC coating was in-line dried at 80° C. and cured under ultraviolet (UV) radiation. The thickness of the cured coating was determined to be approximately 1.8 microns. The cured coating had an optical density of 0.40 when measured using incident light having a wavelength of 1064 nm. All optical densities reported in these examples were measured using the same wavelength of incident light.

TABLE I

First LTHC Coating Solution

| Component | Trade Designation | Parts by Weight |
|---|---|---|
| carbon black pigment | Raven 760 Ultra [1] | 1.99 |
| polyvinyl butyral resin | Butvar ™ B-98 [2] | 0.35 |
| acrylic resin | Joncryl ™ 67 [3] | 1.06 |
| dispersant | Disperbyk ™ 161 [4] | 0.60 |
| surfactant | FC-430 [5] | 0.01 |
| epoxy novolac acrylate | Ebecryl 629 [6] | 15.14 |
| acrylic resin | Elvacite 2669 [7] | 10.10 |
| 2-benzyl-2-(dimethylamino)-1-(4-(morpholinyl)phenyl) butanone | Irgacure ™ 369 [8] | 1.02 |
| 1-hydroxycyclohexyl phenyl ketone | Irgacure ™ 184 [8] | 0.15 |
| 2-butanone | | 43.55 |
| 1,2-propanediol monomethyl ether acetate | | 26.02 |

[1] available from Columbian Chemicals Co., Atlanta, GA
[2] available from Solutia Inc., St. Louis, MO
[3] available from S. C. Johnson & Son, Inc., Racine, WI
[4] available from Byk-Chemie USA, Wallingford, CT
[5] available from Minnesota Mining and Manufacturing Co., St. Paul, MN
[6] available from UCB Radcure Inc., N. Augusta, SC
[7] available from ICI Acrylics Inc., Memphis, TN
[8] available from Ciba-Geigy Corp., Tarrytown, NY Next, a second LTHC solution, as given in Table II, was coated onto the first cured LTHC coating. The second LTHC coating was coated in the same manner as the first LTHC coating. The second LTHC coating was in-line dried at 80° C. and cured under ultraviolet (UV) radiation. The thickness of the second cured coating was determined to be approximately 0.9 microns. The second cured coating had an optical density of 0.79. The two LTHC coatings together formed a non-homogeneous LTHC layer on the PET substrate. The non-homogeneous LTHC layer had an overall thickness of about 2.7 microns and an optical density of about 1.19.

TABLE II

Second LTHC Coating Solution

| Component | Trade Designation | Parts by Weight |
|---|---|---|
| carbon black pigment | Raven 760 Ultra | 5.20 |
| polyvinyl butyral resin | Butvar ™ B-98 | 0.93 |
| acrylic resin | Joncryl ™ 67 | 2.78 |
| dispersant | Disperbyk ™ 161 | 1.53 |
| surfactant | FC-430 | 0.02 |
| epoxy novolac acrylate | Ebecryl 629 | 6.08 |
| acrylic resin | Elvacite 2669 | 4.06 |
| 2-benzyl-2-(dimethylamino)-1-(4-(morpholinyl)phenyl) butanone | Irgacure ™ 369 | 0.41 |
| 1-hydroxycyclohexyl phenyl ketone | Irgacure ™ 184 | 0.06 |
| 2-butanone | | 49.50 |
| 1,2-propanediol monomethyl ether acetate | | 29.43 |

An interlayer coating, given in Table III, was coated onto the non-homogeneous LTHC layer by a rotogravure coating method using the Yasui Seiki Lab Coater, Model CAG-150, with a microgravure roll having 180 helical cells per lineal inch. This coating was in-line dried at 60° C. and UV cured. The thickness of the cured interlayer was determined to be approximately 1.1 microns.

TABLE III

Interlayer Coating Solution

| Component | Parts by Weight |
|---|---|
| trimethylolpropane triacrylate esters (SR 351 HP, available from Sartomer, Exton, PA) | 15.84 |
| Butvar ™ B-98 | 0.99 |
| Joncryl ™ 67 | 2.97 |
| 2-hydroxy-2 methyl-1-phenyl-1-propanone (Duracure ™ 1173, available from Ciba-Geigy, Hawthorne, NY) | 0.99 |
| 2-butanone | 47.52 |
| 1-methoxy-2-propanol | 31.68 |

A blue color transfer layer was formed onto the cured interlayer by rotogravure coating the solution given in Table IV using the Yasui Seiki Lab Coater, Model CAG- 150, with a microgravure roll having 180 helical cells per lineal inch. This color transfer layer coating was in-line dried at 100° C. and was left un-cured. The thickness of the un-cured blue transfer layer was determined to be approximately 1.2 microns. The addition of the transfer layer completed Color Donor 1.

TABLE IV

Blue Transfer Layer Coating Solution

| Component | Parts by Weight |
|---|---|
| blue pigment (Pigment Blue 15:6) (Heliogen Blue L6700F, available from BASF Corp., Mount Olive, NJ) | 3.74 |
| violet pigment (Pigment Violet 23) (HOSTAPERM Violet RL-NF, available from Clariant Corp., Coventry, RI) | 0.16 |
| Disperbyk ™ 161 | 1.59 |
| dispersant (Solsperse 5000, available from Zeneca Inc., Wilmington, DE) | 0.11 |

TABLE IV-continued

Blue Transfer Layer Coating Solution

| Component | Parts by Weight |
|---|---|
| Elvacite 2669 | 4.51 |
| bisphenol A/ novolac epoxy resin (Epon SU-8, available from Shell chemical Co., Houston, TX) | 4.00 |
| 1,2-propanediol monomethyl ether acetate | 68.71 |
| cyclohexanone | 17.18 |

Color Donor 2 (comparative): Homogeneous LTHC Layer

As a comparative example, Color Donor 2, was prepared having a homogeneous LTHC layer. Color Donor 2 was prepared in the same manner as Color Donor 1, except that only one LTHC solution was coated on the PET substrate. The LTHC coating solution used is given in Table V. The thickness of the resulting homogeneous LTHC layer was determined to be about 2.8 microns, and it had an optical density of approximately 1.15. Thus, the overall thickness and optical density of the non-homogeneous LTHC of Color Donor 1 and the homogeneous LTHC of Color Donor 2 were about the same. An interlayer and color transfer layer were provided as above to complete the construction of Color Donor 2.

TABLE V

Homogeneous LTHC Coating Solution

| Component | Trade Designation | Parts by Weight |
|---|---|---|
| carbon black pigment | Raven 760 Ultra | 3.88 |
| polyvinyl butyral resin | Butvar ™ B-98 | 0.69 |
| acrylic resin | Joncryl ™ 67 | 2.07 |
| dispersant | Disperbyk ™ 161 | 1.17 |
| surfactant | FC-430 | 0.01 |
| epoxy novolac acrylate | Ebecryl 629 | 13.18 |
| acrylic resin | Elvacite 2669 | 8.79 |
| 2-benzyl-2-(dimethylamino)-1-(4-(morpholinyl)phenyl) butanone | Irgacure ™ 369 | 0.89 |
| 1-hydroxycyclohexyl phenyl ketone | Irgacure ™ 184 | 0.13 |
| 2-butanone | | 43.37 |
| 1,2-propanediol monomethyl ether acetate | | 25.82 |

Example 2
Imaging of Color Donor Elements

Color Donor 1 and comparative Color Donor 2 were imaged from the substrate side of the donors using a laser imaging system to transfer their respective transfer layers under various imaging conditions. Laser transfer was accomplished using two single-mode Nd:YAG lasers. Scanning was performed using a system of linear galvanometers, with the combined laser beams focused onto the image plane using an f-theta scan lens as part of a near-telecentric configuration. The power on the image plane was approximately 16 W. The laser spot size, measured at the $1/e^2$ intensity, was 30 microns by 350 microns. The linear laser spot velocity was adjustable between 10 and 30 meters per second, measured at the image plane. The laser spot was dithered perpendicular to the major displacement direction with about a 100 $\mu$m amplitude. The transfer layers were transferred as lines onto a glass receptor substrate, and the intended width of the lines was about 90 $\mu$m. The glass receptor substrate was held in a recessed vacuum frame, the donor sheet was placed in contact with the receptor and was held in place via application of a vacuum.

Color Donors 1 and 2 were imaged as a function of laser fluence, or dose, onto separate 1.1 mm thick glass receptors. The ramp-up distance to full laser power was maintained at 500 microns for all doses. The transferred lines were then analyzed for width, edge roughness (calculated as the pooled standard deviation of the respective line width measurements), and the presence of certain imaging defects, specifically LTHC transfer to the receptor and/or fragmentation of the transferred coating, collectively referred to in these Examples as "blow-up" defects. The results of these analyses are provided in tabular form in Table VI and in graphic form in FIG. 3. The bolded numbers in Table VI indicate results for the highest laser dose before reaching 100% blow-up defects for each donor type.

TABLE VI

Color Donor Imaging Performance as a Function of Laser Dose

| Dose | Average Line Width (µm) | | Average Edge Roughness (µm) | | % of Lines with Blow-up Defects | |
|---|---|---|---|---|---|---|
| (joules/cm$^2$) | Donor 1 | Donor 2 | Donor 1 | Donor 2 | Donor 1 | Donor 2 |
| 0.400 | — | 73 | — | 2.1 | — | 0 |
| 0.425 | 69 | 83 | 2.1 | 1.3 | 0 | 0 |
| 0.450 | 77 | 86 | 1.2 | 1.5 | 0 | 0 |
| 0.475 | 84 | 88 | 1.4 | 1.4 | 0 | 0 |
| 0 500 | 86 | 89 | 1.0 | 0.9 | 0 | 92 |
| 0.525 | 90 | 90 | 0.7 | 0.9 | 0 | 100 |
| 0.550 | 91 | 91 | 0.7 | 0.9 | 0 | 100 |
| 0.575 | 93 | 91 | 0.7 | 0.8 | 0 | 100 |
| 0.600 | 93 | 91 | 0.9 | 1.1 | 84 | 100 |
| 0.625 | 94 | 91 | 0.6 | 0.9 | 100 | 100 |
| 0.650 | 94 | 92 | 0.7 | 1.1 | 100 | 100 |
| 0.675 | 95 | 91 | 0.7 | 0.8 | 100 | 100 |
| 0.700 | 96 | 91 | 0.7 | 0.9 | 100 | 100 |

Figure 3A:
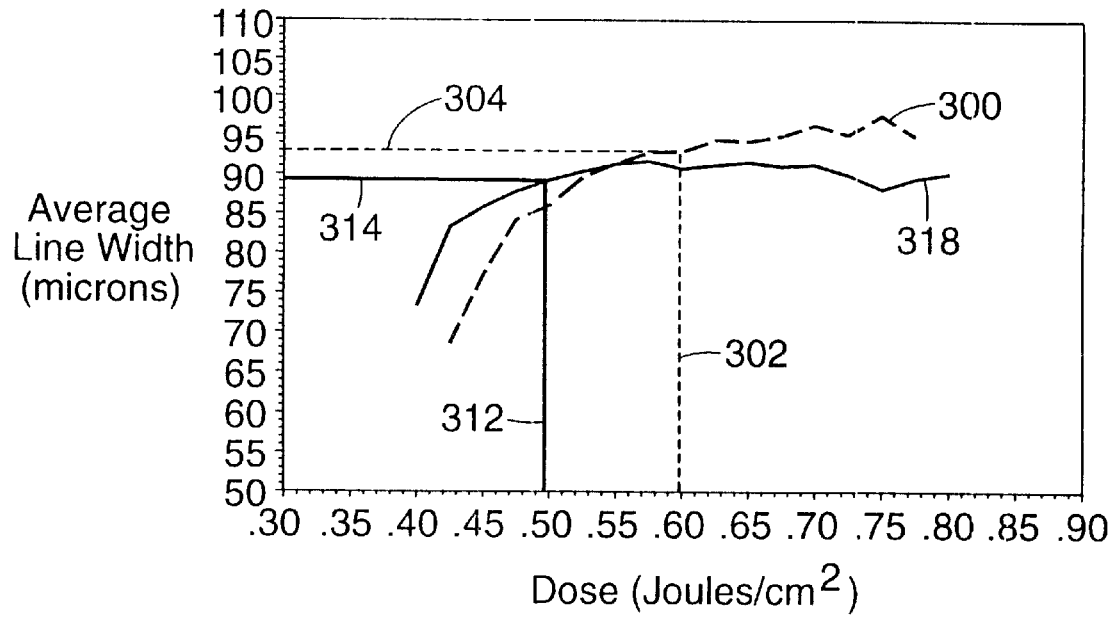
FIG. 3(a) is a plot comparing line width versus laser dose for lines transferred from a donor element that includes a non-homogeneous light-to-heat conversion layer and a donor element that includes a homogeneous light-to-heat conversion layer.

FIG. 3(a) shows plots of average line width versus laser dose for Color Donor 1 (given by line 300) and Color Donor 2 (given by line 310). Line 302 indicates the laser dose at which Color Donor 1 started to show blow-up defects during transfer. Line 304 indicates the largest line width for lines transferred from Color Donor 1 before reaching the imaging dose indicated by line 302. Analogously, line 312 indicates the laser dose at which Color Donor 2 started to show blow-up defects during transfer. Line 314 indicates the largest line width for lines transferred from Color Donor 2 before reaching the imaging dose indicated by line 312. The data shown in Table VI and the plots shown in FIG. 3(a) indicate that the non-homogeneous LTHC layer of Color Donor 1 allows a higher laser dose to be used without forming blow-up defects during transfer. The data and plots also indicate that a higher average line width was attainable using the non-homogeneous LTHC layer of Color Donor 1, most probably due to higher laser doses that could be used during imaging of Color Donor 1 without blow-up.

Figure 3B:
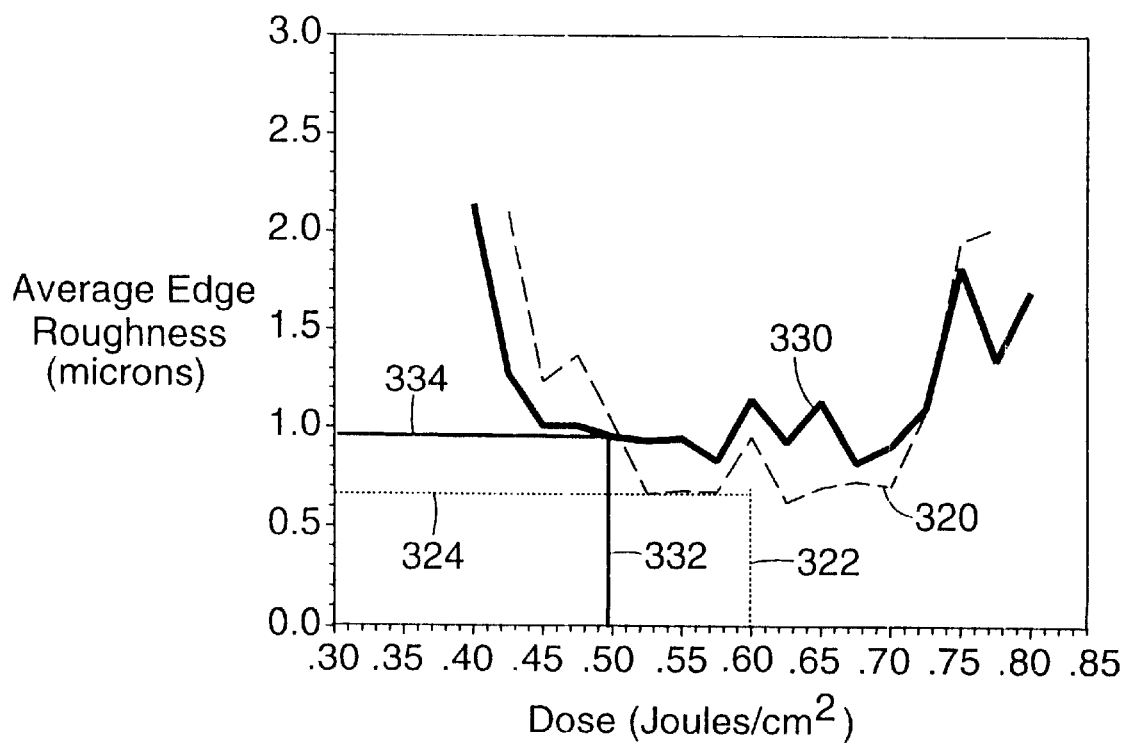
FIG. 3(b) is a plot comparing edge roughness versus laser dose for lines transferred from a donor element that includes a non-homogeneous light-to-heat conversion layer and a donor element that includes a homogeneous light-to-heat conversion layer.

A similar picture is evidenced in FIG. 3(b), which shows plots of average edge roughness versus laser dose for Color Donor 1 (given by line 320) and Color Donor 2 (given by line 330). Lines 322 and 332 indicate the laser doses at which Color Donor 1 and Color Donor 2, respectively, started to show blow-up defects during transfer. Lines 324 and 334 indicate the smallest average edge roughness before reaching the "blow-up dose" for lines transferred using Color Donor 1 and Color Donor 2, respectively. Using the non-homogeneous LTHC layer of Color Donor 1, a higher laser dose could be used without blow-up defects, which allowed lower edge roughnesses to be obtained.

The results of imaging of color donors indicates that donors using a non-homogeneous LTHC layer where the absorption coefficient is higher nearer the transfer layer and lower nearer the direction of incident imaging radiation can improve transfer (e.g., improve average line width and edge roughness) than donors using a homogeneous LTHC layer and imaging in a similar manner. In addition, because of the lack of blow-up defects in Color Donor 1 within a range of laser doses that caused blow-up defects in Color Donor 2, the results indicate that a lower maximum temperature was obtained for the same imaging conditions using the non-homogeneous LTHC layer of Color Donor 1 relative to the homogeneous LTHC layer of Color Donor 2 that had nearly the same thickness and overall optical density.

Example 3

OLED Donor Elements

Two OLED donor elements were made, each having an overall construction such as construction 100 shown in FIG. 1. The two OLED donor sheets, OLED Donor 1 and OLED Donor 2, were the same as to Color Donor 1 and Color Donor 2, respectively, as described above except in their transfer layers. The OLED donors had transfer layers formed onto their respective cured interlayers by the following procedure.

Onto each OLED donor, a 100 Å thick layer of copper phthalocyanine was deposited on the interlayer as a release layer. A 450 Å thick layer of aluminum was deposited on the release layer as a cathode layer. A 10 Å thick layer of lithium fluoride was then deposited on the aluminum coating. A 500 Å thick layer of tris(8-hydroxyquinolinato) aluminum (ALQ$_3$) was deposited as an electron transport layer on the lithium fluoride layer. Finally, a 500 Å thick layer of N,N'-dinaphthyl-N,N'-diphenyl4,4'-diamino biphenyl (NPB) was deposited as a hole transport layer on the electron transport layer. In this way, OLED donors were constructed having multicomponent transfer layers, the donors designated OLED Donor 1, which had the non-homogeneous LTHC layer described above, and OLED Donor 2, which had the homogeneous LTHC layer described above.

All of the vacuum deposited materials were thermally evaporated and deposited at room temperature. The deposition rate and thickness of each vacuum deposited layer was monitored with a quartz crystal microbalance (Leybold Inficon Inc., East Syracuse, N.Y.). The background pressure (chamber pressure prior to the deposition) was roughly $1 \times 10^{-5}$ Torr ($1.3 \times 10^{-3}$ Pa).

Example 4

Imaging of OLED Donor Elements

OLED Donor 1 and OLED Donor 2 were imaged as described above for the color donor elements as a function of dose onto 1.1 mm thick glass receptors coated with indium tin oxide ("ITO"). The ramp-up distance to full laser power was maintained at 500 microns for all doses. The transferred lines were then analyzed for the presence of LTHC blow-up defects (such as those described in Example 2). The results of these analyses are provided in tabular form in Table VII. During transfer, the hole transport layer of the OLED multicomponent transfer layer was in contact with the receptor substrate. When transferred, the order of the layers in the transferred image were the same as on the donor elements except that the outer most layer was the cathode layer and the inner most layer (contacting the receptor) was the hole transport layer.

TABLE VII

OLED Donor Performance as a Function of Imaging Dose

| Imaging Dose | % of Lines with LTHC Blow-up Defects | |
|---|---|---|
| (Joules/cm$^2$) | OLED Donor 1 | OLED Donor 2 |
| 0.400 | partial transfer | no transfer |
| 0.450 | 0 | 0 |
| 0.500 | 0 | 0 |
| 0.550 | 0 | 40 |
| 0.600 | 0 | 80 |
| 0.650 | 0 | 100 |
| 0.700 | 0 | 100 |

The results indicate that higher imaging doses could be used without causing blow-up defects for OLED Donor 1, which had a non-homogeneous LTHC layer, than for OLED Donor 2, which had a homogeneous LTHC layer.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

What is claimed is:

1. A thermal mass transfer donor element comprising:
   a substrate;
   a thermal transfer layer capable of being selectively thermal melt transferred from the donor element to a proximately located receptor; and
   a non-homogeneous light-to-heat conversion layer disposed between the substrate and the transfer layer, the non-homogeneous light-to-heat conversion layer comprising carbon black and having at least two regions that exhibit different absorption coefficients.

2. The donor element of claim 1, wherein the transfer layer includes two or more layers of dissimilar materials capable of being transferred as a single unit.

3. The thermal transfer donor element of claim 1, further comprising an underlayer disposed between the substrate and the light-to-heat conversion layer.

4. The thermal transfer donor element of claim 3, wherein the underlayer has a thermal conductivity that is lower than a thermal conductivity of the substrate.

5. The thermal transfer donor element of claim 3, wherein the underlayer has a thermal conductivity that is higher than a thermal conductivity of the substrate.

6. The thermal transfer donor element of claim 3, wherein the underlayer has an anisotropic thermal conductivity.

7. The donor element of claim 1, further comprising an interlayer disposed between the non-homogeneous light-to-heat conversion layer and the transfer layer.

8. The donor element of claim 7, wherein the interlayer has a thermal conductivity that is lower than a thermal conductivity of the light-to-heat conversion layer.

9. The donor element of claim 7, wherein the interlayer has a thermal conductivity that is higher than a thermal conductivity of the light-to-heat conversion layer.

10. The donor element of claim 7, wherein the interlayer has an anisotropic thermal conductivity.

11. The donor element of claim 2, wherein the two or more layers of the transfer layer include a conductive layer and one or more of an organic electroluminescent layer, a phosphor layer, an electron transport layer, a hole transport layer, and an insulating layer.

12. The donor element of claim 1, wherein the region of the at least two regions that exhibits a higher absorption coefficient is disposed closer to the transfer layer than the other of the two regions.

13. The donor element of claim 1, wherein the non-homogeneous light-to-heat conversion layer comprises a first portion having a first thickness and a first absorption coefficient that is substantially constant over the first thickness and a second portion having a second thickness and a second absorption coefficient that is substantially constant over the second thickness.

14. The donor element of claim 1, wherein the non-homogeneous light-to-heat conversion layer comprises a plurality of layers, each of the plurality of layers having a substantially constant absorption coefficient.

15. The donor element of claim 1, wherein the non-homogeneous light-to-heat conversion layer has an absorption coefficient that varies monotonically with thickness over at least a portion of the light-to-heat conversion layer.

16. The donor element of claim 1, wherein the non-homogeneous light-to-heat conversion layer has an absorption coefficient that varies linearly with thickness over at least a portion of the light-to-heat conversion layer.

17. The donor element of claim 1, wherein the non-homogeneous light-to-heat conversion layer has an absorption coefficient that varies non-linearly with thickness over at least a portion of the light-to-heat conversion layer.

18. The donor element of claim 2, wherein at least one of the two or more layers of the transfer layer includes a light emitting polymer.

19. The donor element of claim 1, wherein the non-homogeneous light-to-heat conversion layer includes a radiation absorbing dye.

20. The donor element of claim 1, wherein the non-homogeneous light-to-heat conversion layer includes a metal, metal oxide, or metal sulfide.

21. The donor element of claim 1, wherein the transfer layer includes a colorant.

22. The donor element of claim 1, wherein the transfer layer includes an organic electroluminescent material.

23. The donor element of claim 1, wherein the transfer layer includes a light emitting polymer.

24. The donor element of claim 1, wherein the transfer layer includes a phosphor.

25. The donor element of claim 1, wherein the transfer layer includes one or more of colorants, polarizing materials, liquid crystal materials, particles, emissive materials, hydrophobic materials, hydrophilic materials, multilayer stacks, microstructured layers, nanostructured layers, photoresist, metals, polymers, organic conductors, organic semiconductors, adhesives, binders, enzymes or other biomaterials.

26. A method for selective thermal mass transfer comprising the steps of:
   providing a donor element that includes a thermal transfer layer and a light-to-heat conversion layer comprising carbon black, the light-to-heat conversion layer having at least two regions exhibiting different absorption coefficients;
   placing the thermal transfer layer of the donor element adjacent to a receptor substrate; and
   thermally transferring portions of the thermal transfer layer from the donor element to the receptor substrate by selectively irradiating the donor element with imaging radiation that can be absorbed and converted into heat by the light-to-heat conversion layer.

27. The method of claim 26, wherein the imaging radiation is incident directly on the donor element.

28. The method of claim 26, wherein the imaging radiation is incident on the donor element through the receptor substrate.

29. The method of claim 26, wherein the donor element further includes a substrate, the light-to-heat conversion layer being disposed between the substrate and the thermal transfer layer.

30. The method of claim 29, wherein the donor element further includes an underlayer disposed between the substrate and the light-to-heat conversion layer.

31. The method of claim 30, wherein the underlayer has an anisotropic thermal conductivity.

32. The method of claim 26, wherein the donor element further includes an interlayer disposed between the light-to-heat conversion layer and the thermal transfer layer.

33. The method of claim 32, wherein the interlayer has an anisotropic thermal conductivity.

34. The method of claim 26, wherein the region of the at least two regions of the light-to-heat conversion layer that has a higher absorption coefficient is disposed closer to the thermal transfer layer.

35. The method of claim 26, wherein the light-to-heat conversion layer comprises a plurality of layers, each of the plurality of layers having a substantially constant absorption coefficient.

36. The method of claim 26, wherein the light-to-heat conversion layer has an absorption coefficient that varies monotonically with thickness over at least a portion of the light-to-heat conversion layer.

37. The method of claim 26, wherein the light-to-heat conversion layer has an absorption coefficient that varies linearly with thickness over at least a portion of the light-to-heat conversion layer.

38. The method of claim 26, wherein the light-to-heat conversion layer has an absorption coefficient that varies non-linearly with thickness over at least a portion of the light-to-heat conversion layer.

39. The method of claim 26, wherein the light-to-heat conversion layer includes a radiation absorbing dye.

40. The method of claim 26, wherein the light-to-heat conversion layer includes a metal, metal oxide, or metal sulfide.

41. The method of claim 26, wherein the transfer layer includes a colorant.

42. The method of claim 26, wherein the transfer layer includes an organic electroluminescent material.

43. The method of claim 26, wherein the transfer layer includes a light emitting polymer.

44. The method of claim 26, wherein the transfer layer includes a phosphor.

45. The method of claim 26, wherein the transfer layer includes two or more layers of dissimilar materials capable of being transferred as a single unit.

46. The method of claim 45, wherein the two or more layers of the transfer layer include a conductive layer and one or more of an organic electroluminescent layer, a phosphor layer, an electron transport layer, a hole transport layer, and an insulating layer.

47. The method of claim 45, wherein at least one of the two or more layers of the transfer layer includes a light emitting polymer.

48. The method of claim 26, wherein the receptor comprises glass.

49. The method of claim 26, wherein the receptor comprises a polymer film.

50. The method of claim 26, wherein the receptor comprises a display panel substrate.

51. The method of claim 50, wherein the receptor comprises active or passive devices for activating pixels in an electronic display.

* * * * *

UNITED STATES PATENT AND TRADEMARK OFFICE
CERTIFICATE OF CORRECTION

PATENT NO. : 6,228,555 B1
DATED : May 8, 2001
INVENTOR(S) : Thomas R. Hoffend, Jr. and John S. Staral It is certified that error appears in the above-identified patent and that said Letters Patent is hereby corrected as shown below:

<u>Column 16,</u>
Line 4, "Zeonexm" should read -- Zeonex$^{TM}$ --.
Line 24, "(ET)" should read -- (PET) --.

<u>Column 17,</u>
Line 26, "UW" should read -- UV --.

Signed and Sealed this

Ninth Day of April, 2002

Attest:

JAMES E. ROGAN
*Attesting Officer*     *Director of the United States Patent and Trademark Office*